US012119062B2

(12) United States Patent
Kaynak et al.

(10) Patent No.: US 12,119,062 B2
(45) Date of Patent: Oct. 15, 2024

(54) MANAGING COMPENSATION FOR CELL-TO-CELL COUPLING AND LATERAL MIGRATION IN MEMORY DEVICES BASED ON A SENSITIVITY METRIC

(71) Applicant: Micron Technology, Inc., Boise, ID (US)

(72) Inventors: Mustafa N. Kaynak, San Diego, CA (US); Patrick R. Khayat, San Diego, CA (US); Sivagnanam Parthasarathy, Carlsbad, CA (US)

(73) Assignee: Micron Technology, Inc., Boise, ID (US)

( * ) Notice: Subject to any disclaimer, the term of this patent is extended or adjusted under 35 U.S.C. 154(b) by 196 days.

(21) Appl. No.: 17/884,113

(22) Filed: Aug. 9, 2022

(65) Prior Publication Data
US 2024/0055050 A1 Feb. 15, 2024

(51) Int. Cl.
G11C 16/08 (2006.01)
G06F 3/06 (2006.01)
G11C 16/10 (2006.01)
G11C 16/34 (2006.01)
G11C 16/04 (2006.01)

(52) U.S. Cl.
CPC ............ G11C 16/08 (2013.01); G06F 3/0604 (2013.01); G06F 3/0655 (2013.01); G06F 3/0679 (2013.01); G11C 16/10 (2013.01); G11C 16/3459 (2013.01); *G11C 16/0483* (2013.01)

(58) Field of Classification Search
CPC ...................................... G11C 16/08
See application file for complete search history.

(56) References Cited

U.S. PATENT DOCUMENTS

| | | | |
|---|---|---|---|
| 11,545,229 B1* | 1/2023 | Sharifi Tehrani | G11C 29/42 |
| 2008/0198650 A1* | 8/2008 | Shalvi | G06F 11/1068 365/45 |
| 2011/0066902 A1* | 3/2011 | Sharon | G11C 29/52 714/E11.034 |
| 2011/0216598 A1* | 9/2011 | Kim | G11C 16/26 365/189.05 |
| 2016/0011970 A1* | 1/2016 | Sakurada | G06F 12/0246 711/103 |

* cited by examiner

*Primary Examiner* — Douglas King
(74) *Attorney, Agent, or Firm* — LOWENSTEIN SANDLER LLP

(57) ABSTRACT

Embodiments disclosed can include determining, for a wordline of the plurality of wordlines, a respective value of a sensitivity metric that reflects a sensitivity of a threshold voltage of a memory cell associated with the wordline to a change in a threshold voltage of an adjacent memory cell. Embodiments can also include determining, for the wordline, that the respective value of the sensitivity metric satisfies a threshold criterion. Embodiments can further include responsive to determining that the respective value of the sensitivity metric satisfies the threshold criterion, associating the wordline with a first wordline group, wherein the first wordline group comprises one or more wordlines, and wherein each wordline of the one or more wordlines is associated with a respective value of the sensitivity metric that satisfies the threshold criterion. Embodiments can include performing, on a specified memory cell connected to the wordline associated with the first wordline group, a compensatory operation.

20 Claims, 10 Drawing Sheets

MANAGING COMPENSATION FOR CELL-TO-CELL COUPLING AND LATERAL MIGRATION IN MEMORY DEVICES BASED ON A SENSITIVITY METRIC

TECHNICAL FIELD

Embodiments of the disclosure relate generally to memory sub-systems, and more specifically, relate to managing compensation for cell-to-cell coupling and lateral migration in memory devices based on a sensitivity metric.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
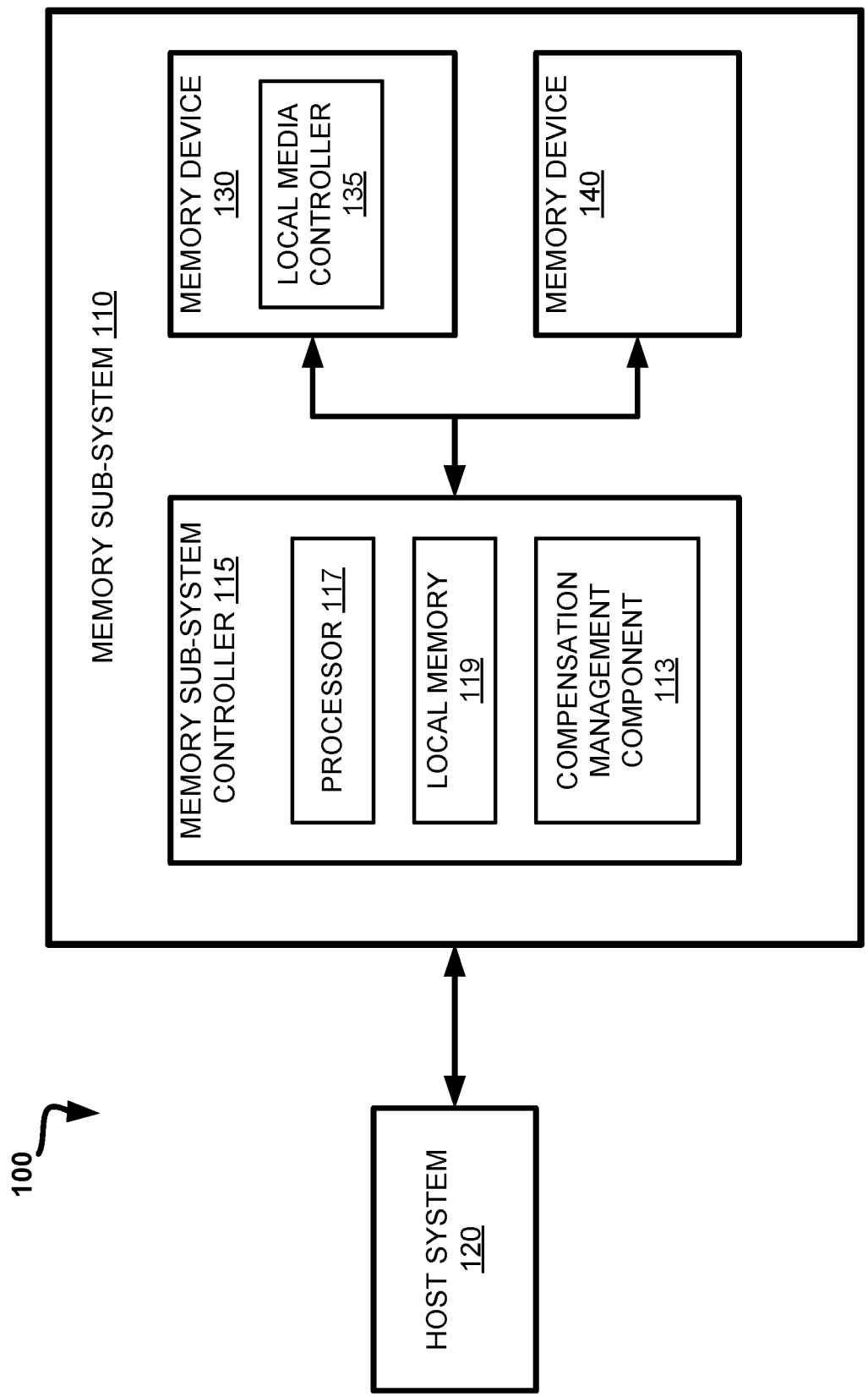
FIG. 1 illustrates an example computing system that includes a memory sub-system in accordance with some embodiments of the present disclosure.

Aspects of the present disclosure are directed to managing compensation for cell-to-cell coupling and lateral migration in memory devices based on a sensitivity metric. A memory sub-system can be a storage device, a memory module, or a combination of a storage device and memory module. Examples of storage devices and memory modules are described below in conjunction with FIGS. 1-2A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIGS. 1-2A. A non-volatile memory device is a package of one or more dies. Each die can consist of one or more planes. For some types of non-volatile memory devices (e.g., NAND devices), each plane includes a set of physical blocks. Each block includes a set of pages. Each page includes a set of memory cells ("cells"). A memory cell is an electronic circuit that stores information. Depending on the memory cell type, a memory cell can store one or more bits of binary information, and has various logic states that correlate to the number of bits being stored. The logic states can be represented by binary values, such as "0" and "1", or combinations of such values.

A memory device includes multiple memory cells arranged in a two-dimensional or three-dimensional grid. Memory cells are formed on (e.g., etched onto) a silicon wafer in an array of columns connected by conductive lines (also hereinafter referred to as bitlines) and rows connected by conductive lines (also hereinafter referred to as wordlines). A wordline can refer to a conductive line that connects control gates of a set (e.g., one or more rows) of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types. In another example, the memory device can include multiple access line driver circuits and power circuits that can be shared by the planes of the memory device. For ease of description, these circuits can be generally referred to as independent plane driver circuits. Depending on the storage architecture employed, data can be stored across the memory planes (i.e., in stripes). Accordingly, one request to read a segment of data (e.g., corresponding to one or more data addresses), can result in read operations performed on two or more of the memory planes of the memory device.

A memory cell ("cell") can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_t$ (also referred to as the "threshold voltage") such that the source-drain electric current is low for the control gate voltage ($V_{CG}$) being below the threshold voltage, $V_{CG}<V_t$. The current increases substantially once the control gate voltage has exceeded the threshold voltage, $V_{CG}>V_t$. Because the actual geometry of the electrodes and gates varies from cell to cell, the threshold voltages can be different even for cells implemented on the same die. The cells can, therefore, be characterized by a distribution P of the threshold voltages, $P(Q,V_t)=dW/dV_t$, where dW represents the probability that any given cell has its threshold voltage within the interval $[V_t, V_t+dV_t]$ when charge Q is placed on the cell.

A programming operation can include the application of a series of incrementally increasing programming pulses to a control gate of a memory cell being programmed. A program verify operation after each programming pulse determines the threshold voltage of the memory cell resulting from the preceding programming pulse. When memory cells are programmed, the level of the programming achieved in a cell (e.g., the $V_t$ of the cell) is verified, in effect, by comparing the cell $V_t$ to a target (i.e., desired) program verify (PV) voltage level. The PV voltage level can be provided by an external reference.

A typical program verify operation includes referring to a target threshold voltage and applying a ramped voltage to the control gate of the memory cell being verified. When the ramped voltage reaches the threshold voltage to which the memory cell has been programmed, the memory cell turns on and sense circuitry detects a current on a bit line coupled to the memory cell. The detected current activates the sense circuitry to compare whether the present threshold voltage is greater than or equal to the stored target threshold voltage. If the present threshold voltage is greater than or equal to the target threshold voltage, further programming is inhibited. Otherwise, programming typically continues in this manner with the application of additional programming pulses to the memory cell until the target PV of a corresponding $V_t$ and data state is achieved.

Accordingly, certain non-volatile memory devices can use a demarcation voltage (i.e., a read reference voltage) to read data stored at memory cells. For example, a read reference voltage can be applied to the memory cells, and if a threshold voltage of a specified memory cell is identified as being below the read reference voltage that is applied to the specified memory cell, then the data stored at the specified memory cell can be read as a particular value (e.g., a logical '1') or determined to be in a particular state (e.g., a set state). If the threshold voltage of the specified memory cell is identified as being above the read reference voltage, then the data stored at the specified memory cell can be read as another value (e.g., a logical '0') or determined to be in another state (e.g., a reset state). Thus, the read reference voltage can be applied to memory cells to determine values stored at the memory cells. Such threshold voltages can be within a range of threshold voltages or comprise a normal distribution of threshold voltages.

A memory device can exhibit threshold voltage distributions $P(Q, V_t)$ that are narrow compared with the working range of control voltages tolerated by the cells of the device. Accordingly, multiple non-overlapping distributions $P(Q_k, V_t)$ ("valleys") can be fit into the working range allowing for storage and reliable detection of multiple values of the charge $Q_k$, k=1, 2, 3 . . . . The distributions (valleys) are interspersed with voltage intervals ("valley margins") where none (or very few) of the cells of the device have their threshold voltages. Such valley margins can, therefore, be used to separate various charge states $Q_k$—the logical state of the cell can be determined by detecting, during a read operation, between which two valley margins the respective threshold voltage $V_t$ of the cell resides. This effectively allows a single memory cell to store multiple bits of information: a memory cell operated with 2N−1 well-defined valley margins and 2N valleys is capable of reliably storing N bits of information. Specifically, the read operation can be performed by comparing the measured threshold voltage $V_t$ exhibited by the memory cell to one or more reference voltage levels corresponding to known valley margins (e.g., centers of the margins) of the memory device in order to distinguish between the multiple logical programming levels and determine the programming state of the cell.

One type of cell is a single level cell (SLC), which stores 1 bit per cell and defines 2 logical states ("states") ("1" or "L0" and "0" or "L1") each corresponding to a respective $V_t$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_t$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_t$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use 2 n levels of charge to store n bits. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of cells.

A valley margin can also be referred to as a read window. For example, in a SLC cell, there is 1 read window that exists with respect to the 2 $V_t$ distributions. Analogously, in an MLC cell, there are 3 read windows that exist with respect to the 4 $V_t$ distributions. Similarly, in a TLC cell, there are 7 read windows that exist with respect to the 8 $V_t$ distributions. Read window size generally decreases as the number of states increases. For example, the 1 read window for the SLC cell may be larger than each of the 3 read windows for the MLC cell, and each of the 3 read windows for the MLC cell may be larger than each of the 7 read windows for the TLC cell, etc. Read window budget (RWB) refers to the cumulative value of the read windows.

Cells of a memory array that are to be programmed during a write operation and/or read during a read operation can be referred to specified cells (i.e., target cells) connected to a target wordline. The specified cells can neighbor adjacent cells connected to at least one wordline neighboring the specified wordline ("adjacent wordline," i.e., the wordline to which the specified cell is connected). For example, the at least one adjacent wordline can be a single wordline neighboring the specified wordline or a pair of wordlines neighboring the target wordline. Illustratively, the specified wordline can be referred to as an n-th wordline ($WL_n$), and the at least one adjacent wordline can include at least one of adjacent wordline n−1 ($WL_{n-1}$) or adjacent wordline n+1 ($WL_{n+1}$). For example, in a 3D memory device, the set of adjacent wordlines can include a wordline located directly above the target wordline and/or a wordline located directly below the target wordline.

Accordingly, each specified cell can have a respective group of adjacent cells. Each group of adjacent cells can include at least one cell that neighbors its respective specified cell (e.g., one cell connected to $WL_{n-1}$ and/or one cell connected to $WL_{n+1}$). More specifically, each specified cell can be connected to the same bitline as each cell of the respective group of adjacent cells, such that the specified cell and the cells of the respective group of adjacent cells are within the same string. Accordingly, each group of adjacent cells can include a single adjacent cell, or a pair of adjacent cells connected to a same bitline as a respective specified cell.

Some memory devices are subject to physical phenomena that affect the charge stored in their cells and, consequently, also affect the respective threshold voltages of the cells. These phenomena can arise in a memory array between one or more specified cells and their respective groups of adjacent cells. A couple of such phenomena are referred to herein as cell-to-cell coupling (i.e., capacitive coupling between cells that causes interference) and lateral migration (i.e., charge migration between adjacent cells). Cell-to-cell coupling between cells occurs due to capacitive coupling between charge storage structures (e.g., transistors) of adjacent memory cells. For example, the $V_t$ of a specified cell programmed to a target state (e.g., a particular programming level) can change due to capacitive coupling associated with transistors of adjacent cells. The amount of $V_t$ change (i.e., $V_t$ shift), of the specified cell due to cell-to-cell coupling can depend on the $V_t$ of one or more adjacent cells. For instance, adjacent cells programmed to a higher programming level (i.e., a state associated with a higher $V_t$) may have a greater effect on the $V_t$ of the specified cell than adjacent cells programmed to a lower programming level (i.e., a state associated with a lower $V_t$). In some instances, the $V_t$ shift of a specified cell caused by the programming of an adjacent cell can lead to erroneous sensing (e.g., during a memory access operations) of the specified cell.

Lateral migration can have analogous effects. For example, after a cell adjacent to a specified cell is programmed, the electrons can diffuse laterally (i.e., along the wordline) from the charge storage structure of the adjacent cell toward the charge storage structures of the specified cell by tunneling through intervening layers between them. Moreover, this diffusion can depend on (i.e., may be a function of) the respective programming level of neighboring cells connected to the same bitline as the specified cell. Consequently, lateral migration of charge (i.e., as a function of time and of the programming levels of the adjacent cells on the bitline) from an adjacent cell on the wordline can also shift the $V_t$ of the specified cell due to the loss of charge (i.e., electrons) that was previously present.

Accordingly, both cell-to-cell coupling and lateral migration can lead to significant $V_t$ shifts which can depend on the programming level of adjacent cells along the bitline of a specified cell. For example, the shift can be sufficient to cause memory access operations performed on the specified cell to result in a determined sensed state other than the one associated with the programming level of the specified cell. Consequently, for a given programming level, the cells in the memory device can be characterized by multiple $V_t$ sub-distributions with each sub-distribution being associated with (e.g., caused by) a particular programming level of an adjacent cell (e.g., via one of the aforementioned phenomena). The mean of each of these distributions will be shifted from the default $V_t$ for a given programming level by an amount correlated with the programming level of the corresponding group of adjacent cell(s). Thus, when these effects are considered for a multiple cells in one or more memory arrays on a memory device, these phenomena can result in a lowering and widening of the $V_t$ distribution for any programmed state and therefore impair the ability to accurately read the cells. The $V_t$ distribution widening can, in turn, cause RWB degradation and negatively affect memory device reliability. For example, RWB degradation can lead to an increase in the number of errors (e.g., bit errors) and/or error rate (e.g., bit error rate (BER)).

More specifically, cell-to-cell coupling and lateral migration can entail a change in $V_t$ of one transistor (e.g., of a memory cell) influencing the $V_t$ of one or more neighboring transistors (e.g., of a memory cell) to shift through a parasitic capacitance-coupling effect. These $V_t$ shifts disadvantageously result in an expansion of the corresponding $V_t$ distributions (i.e., of multiple cells in an array) in order to accommodate all possible threshold voltages for a given state and further results in a reduction of the RWB corresponding to the programming distributions associated with the various programming levels. Notably, the RWB can refer to the cumulative value (e.g., in voltage) of a number (e.g., seven) of distances (e.g., measured in voltage) between adjacent threshold voltage distributions at a particular BER. For the purposes of the present disclosure, in the context of cell-to-cell coupling and lateral migration phenomena, a cell whose $V_t$ is affected by the programming level of a neighboring cell can be referred to herein as a "victim" cell. Analogously, in the same context, a cell whose programming level affects the $V_t$ of a neighboring cell can be referred to herein as an "aggressor" cell.

In some situations, the effects of cell-to-cell coupling and lateral migration can be mitigated by compensation during read operations or programming (i.e., write) operations that are performed on the cells of the memory device. More specifically, adjustments can be made to voltages applied to a cell in the course of read operations and write operations to compensate for the multiple shifted $V_t$ sub-distributions created due to the effects of corresponding programming levels of one or more adjacent aggressor cells. These adjusted voltages (e.g., a read reference voltage or a program-verify voltage) applied in the course of such memory access operations can be offset (e.g., in an opposite direction) relative to the $V_t$ of a specified cell to counteract the effects of cell-to-cell coupling and lateral migration. In general, each possible $V_t$ shift of a specified memory cell caused by one or more adjacent aggressor cell's programming level can be accounted by shifting the means (i.e., mathematical averages) of the resulting $V_t$ sub-distributions closer together or even by aligning them completely. This alignment can be achieved during programming of the cell by applying offset programming voltage pulses and PV voltages to the cell such that the resulting $V_t$ of the cell aligns with the desired target value due to effect of cell-to-cell coupling and lateral migration. Similarly, an alignment of sensed $V_t$ can be achieved when reading a cell by offsetting a read reference voltage such that the perceived sensed state's $V_t$ aligns with the desired target value after the effect of cell-to-cell coupling and lateral migration is considered. Accordingly, the respective means of the sub-distributions can be shifted and aligned by applying one or more adjusted voltages to the specified memory cell during a memory access operation. Shifting the means of the sub-distributions closer together compensates for the widening of the overarching distribution for a given specified cell programming level caused by cell-to-cell coupling and lateral migration effects of the aggressor memory cells.

In some cases, different cells on a memory device can be differently affected by the cell-to-cell coupling and lateral migration phenomena. More specifically, the shift in $V_t$ of some cells in the device (caused by an adjacent cell at programming level N) will be greater in magnitude for some cells than for others. Accordingly, some victim cells are more sensitive to the changes in the programming level of adjacent aggressor cells and therefore have a higher aggressor cell programming state dependence. For each programming level of an adjacent aggressor cell, there exists a corresponding victim cell $V_t$ sub-distribution for a given victim cell programming level. Therefore, the further the separation (e.g., in volts) of a sub-distribution attributable to the lowest aggressor memory cell programming level from the sub-distribution attributable to the highest aggressor memory cell programming level, the more sensitive the victim cell is to the aggressor memory cell state. Thus, a spread, defined as a difference between the mean of the sub-distribution attributable to the highest aggressor memory cell programming level and the mean of the sub-distribution attributable to the lowest aggressor memory cell programming level, can serve as a measure of a victim cell's $V_t$ sensitivity or dependence on an aggressor cell programming level. In some cases, victim cells connected to a common wordline tend to have similar sensitivities to aggressor cell programming levels while victim cells connected to different wordlines tend to have different sensitivities. In some cases, victim cells connected to a common wordline located on a particular die tend to have similar sensitivities to aggressor cell programming cells while victim cells connected to another wordline located on a another die tend to have different sensitivities.

Perfect compensation, for a particular programming level of a specified cell, can be achieved by aligning the means of all of the possible sub-distributions to account for all the possible corresponding $V_t$ shifts caused by cell-to-cell coupling and lateral migration effects of the aggressor memory cells. Accordingly, perfect compensation narrows the spread of the $V_t$ sub-distributions and thereby narrows the overarching $V_t$ distribution for a given programming level to enlarge one or more read windows and result in an increased RWB for a set of memory cells. As used herein, for a set of cells including a victim cell and one or more adjacent aggressor cells, "perfect compensation" refers to precise compensation for each of the possible specific cell-to-cell coupling and lateral migration effects on the victim cell. In other words, "perfect compensation" refers to an adjustment of an operation parameter that compensates for all of the possible victim cell $V_t$ shifts that can be caused by any of the corresponding programming states/levels to which the adjacent aggressor cells can be programmed.

However, the number and the parameters of the adjustments to the voltages applied during a memory cell access operation to compensate for the aforementioned effects can vary depending on multiple factors. For example, (i) the geometry of the array of memory cells; (ii) the sensitivity of a victim memory cells to an aggressor cell state; (iii) the programming level of a victim cell, (iv) the programming level of an aggressor cell, (v) the desired (i.e., target) RWB, the (vi) amount (e.g., in bits) of information about the aggressor cell programming levels that is to be used; (vii) the amount of energy used; (vii) the amount of time used can each determine how a memory cell access operation is modified to compensate for the cell-to-cell coupling and lateral migration effects, etc. Accordingly, there can be variability within wordlines depending on one or more of the aforementioned factors.

Modification of the default parameters (e.g., adjustment of applied voltage levels) of the memory cell access operation can be tailored to achieve a desired RWB increase based on constraints relating to one or more of the aforementioned factors. The modifications of these parameters can depend on determining the programming levels of the specified cell and the neighboring cell in order to select an appropriate adjustment that accurately compensates for the effects on the specified cell. Therefore, modifying the memory access operation can entail having to perform multiple operations on the specified cell and adjacent cells to determine the parameter adjustments that would accurately compensate for the cell-to-cell coupling and lateral migration effects. Due to this, the level of precision that is needed to determine the aggressor cell programming levels is directly correlated with the time it takes to make that determination. Accordingly, achieving a large RWB increase can require a proportionally longer amount of time.

In some cases, all the possible shifts caused by the various possible states (i.e., programming levels) of one or more aggressor memory cell may need to be accounted for in order to achieve perfect compensation for a specified cell and thereby achieve a maximum possible increase in the RWB. However, this can often be an extremely resource intensive approach due to the additional operations needed to determine the modified parameters (e.g., adjusted voltages) for use with the memory access operation. Consequently, perfect compensation of these effects leads to increased time (e.g., tRead or tProg) needed to complete respective modified read or write operations and can significantly delay the transmission of data to or from the host device. However, in many cases, it might not be necessary to obtain a maximum possible increase in RWB to achieve a desired performance improvement (e.g., decreased BER). For example, it may be the case that a lower increase in RWB is sufficient to achieve a target improvement in BER without needing to incur additional resource and time costs associated with perfect compensation. Accordingly, in such situations, perfect compensation wastes time and resources and detrimentally increases data transfer latency between the memory device and host device.

Aspects of the present disclosure address the above and other deficiencies by balancing the resource and time demands of modifying memory access operations to compensate for cell-to-cell (C2C) coupling and lateral migration (LM) effects with achieving a desired RWB increase by taking into account the aggressor cell programming sensitivity of victim cells connected to particular wordlines and/or residing on particular die. The various embodiments described herein facilitate obtaining sufficient RWB gains without expending more computing resources than necessary to compensate for the aforementioned detrimental C2C coupling and LM effects based on the sensitivity to those effects. In general, in some embodiments, this is accomplished by determining how sensitive the memory cells are (i.e., how sensitive the $V_t$ of a group of victim cells is) with respect to aggressor memory cell states (i.e., the programming levels of one or more aggressor memory cells adjacent to respective victim cells) and performing subsequent compensatory operations (e.g., adjusting the PV voltage for victim cells to compensate for C2C and LM effects) based on that sensitivity.

Taking these factors into consideration, the embodiments of the present disclosure group wordlines based on the sensitivity of the cells respectively connected to those wordlines to the programming levels of adjacent aggressor memory cells so that the compensatory operations can be performed accordingly. Since cells connected to the same wordline tend to have similar sensitivities, each wordline can be associated with a corresponding level of sensitivity. Some embodiments of the present disclosure can categorize and/or group wordlines into high sensitivity and/or low sensitivity wordline groups where each wordline group has wordlines based on whether the aggressor memory cell programming level sensitivity of the victim cells connected to the wordline satisfies a threshold criterion (e.g., has a sensitivity level value above a predetermined threshold value). Wordlines with high sensitivity can be referred to herein as "weak" wordlines, and wordlines with low sensitivity can be referred to herein as "strong" wordlines. Some embodiments of the present disclosure can store a record of the respective sensitivities and corresponding wordline groups on the memory device to be used as a reference for performing compensatory operations. For example, in some cases, the compensatory operations can include adjusting the program verify (PV) voltage of victim cells connected to "weak" wordlines, rather than victim cells connected to "strong" wordlines.

Some embodiments of the present disclosure include determining, for a wordline of a set of wordlines of a memory device, a respective value of a sensitivity metric (e.g., spread) that reflects a sensitivity of a threshold voltage associated with a memory cell (e.g., victim cell) connected to the wordline to a change in a threshold voltage of an adjacent cell (e.g., aggressor cell). If the respective value of the sensitivity metric is determined to satisfy a threshold criterion (e.g., the respective value of the sensitivity metric is greater than or equal to a threshold sensitivity value), then the wordline is associated with a first group of wordlines, where each wordline in the first group of wordlines is associated with a respective value of the sensitivity metric that also satisfies the threshold criterion (e.g., each wordline has a respective value of the sensitivity metric that is greater than or equal to the threshold sensitivity value). The threshold sensitivity value can be determined during characterization and testing of the memory device at manufacturing and/or the threshold sensitivity value can be an adjustable value. A compensatory operation can be performed on a memory cell connected to the wordline associated with the first group of wordlines. If the respective value of the sensitivity metric is determined to not satisfy the threshold criterion (e.g., the respective value of the sensitivity metric is less than the threshold sensitivity value), then the wordline is associated with a second group of wordlines, where each wordline in the second group of wordlines is associated with a respective value of the sensitivity metric that also does not satisfy the threshold criterion (e.g., each wordline has a respective value of the sensitivity metric that is less than the threshold sensitivity value).

Advantages of the embodiments of the present disclosure include, but are not limited to, conserving resources when compensating for the effects of C2C coupling and LM. For example, a less resource intensive approach is implemented to reduce the time needed to complete compensatory operations based on wordline sensitivity to these effects. Accordingly, resources and time are conserved for compensatory operations in cases where extensive program verify operations might be ineffective and are efficiently used in cases where they will result in a sufficient BER decrease. Thus, the embodiments disclosed herein improve the efficiency of compensatory operations (e.g., remedial modifications to programming operations that compensate for C2C coupling and LM effects) by reducing the time and energy used for performing the compensatory operations.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a compensation management component 113 that can manage compensation for cell-to-cell coupling and lateral migration in the memory device 130 based on a sensitivity metric. In some embodiments, the memory sub-system controller 115 includes at least a portion of the compensation management component 113. In some embodiments, the compensation management component 113 is part of the host system 110, an application, or an operating system. In other embodiments, local media controller 135 includes at least a portion of compensation management component 113 and is configured to perform the functionality described herein.

In some embodiments, the compensation management component 113 can determine, for a wordline of a set of wordlines of a memory device, a respective value of a sensitivity metric (e.g., spread) that reflects a sensitivity of a threshold voltage associated with a memory cell (e.g., victim cell) connected to the wordline to a change in a threshold voltage of an adjacent cell (e.g., aggressor cell). The compensation management component 113 can determine that the respective value of the sensitivity metric satisfies a threshold criterion (e.g., the respective value of the sensitivity metric is greater than or equal to a threshold sensitivity value). Responsive to determining that the respective value of the sensitivity metric satisfies the threshold criterion, the compensation management component 113 can associate the wordline with a first group of wordlines, where each wordline in the first group of wordlines is associated with a respective value of the sensitivity metric that also satisfies the threshold criterion (e.g., each wordline has a respective value of the sensitivity metric that is greater than or equal to the threshold sensitivity value). The threshold sensitivity value can be determined during characterization and testing of the memory device at manufacturing and/or the threshold sensitivity value can be an adjustable value. The compensation management component 113 can perform a compensatory operation on a memory cell connected to the wordline associated with the first group of wordlines. If the respective value of the sensitivity metric is determined to not satisfy the threshold criterion (e.g., the respective value of the sensitivity metric is less than the threshold sensitivity value), then the compensation management component 113 can associate wordline with a second group of wordlines, where each wordline in the second group of wordlines is associated with a respective value of the sensitivity metric that also does not satisfy the threshold criterion (e.g., each wordline has a respective value of the sensitivity metric that is less than the threshold sensitivity value). Further details with regards to the operations of the compensation management component 113 are described below.

Figure 2A:
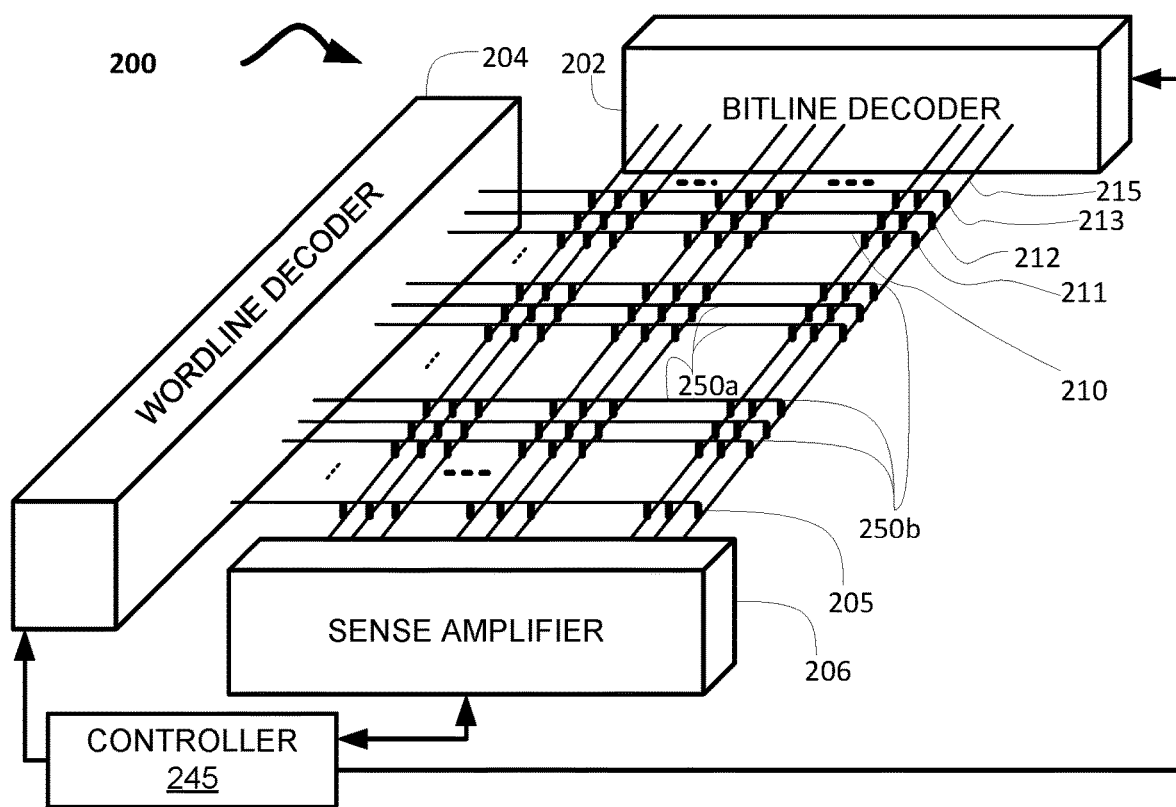
FIG. 2A illustrates an example array of memory cells in accordance with some embodiments of the present disclosure.

FIG. 2A illustrates an example array of memory cells, in accordance with some embodiments of the present disclosure. FIG. 2A illustrates an array 200 of multiple TLC memory cells 205, 211, 212, 213. Memory array 200 can include multiple wordlines 210 (e.g., row lines) and multiple bitlines 215 (e.g., column lines, pillars), labeled. In some embodiments, each row of memory cells 205, 211, 212, 213 is connected to a wordline 210, and each column of memory cells 205, 211, 212, 213 is connected to a bitline 215. Activating or selecting a wordline 210 or a bitline 215 can include applying a voltage to the respective lines.

Wordlines 210 and bitlines 215 can be substantially perpendicular (i.e., orthogonal) to one another or otherwise intersect one another to create an array of memory cells. As shown in FIG. 2A, one memory cell 212 can be located at the intersection of two conductive lines such as a wordline 210 and a bitline 215. This intersection can be referred to as an address of a memory cell 212. A specified memory cell 212 can be a memory cell 212 located at the intersection of an energized wordline 210 and bitline 215; that is, wordline 210 and bitline 215 can be energized to read, write, or otherwise access a memory cell 212 at their intersection. Other memory cells 205, 211, 213 that are in electronic communication with (e.g., connected to) the same wordline 210 or bitline 215 can be referred to as unspecified memory cells 205, 211, 213.

Electrodes can be coupled to a memory cell 205, 211, 212, 213 and a wordline 210 or a bitline 215. The term electrode can refer to an electrical conductor, and in some embodiments, can be employed as an electrical contact to a memory cell 205, 211, 212, 213. An electrode can include a trace, wire, conductive line, conductive layer, or the like that provides a conductive path between elements or components of memory device 130. In some examples, a memory cell 205, 211, 212, 213 can include multiple self-selecting or other memory components (e.g., a selection component and a storage component) separated from each other and from access lines 210, 215 by electrodes. For self-selecting memory cells 205, 211, 212, 213, a single component (e.g., a section or layer of chalcogenide material within the memory cell 205, 211, 212, 213) can be used as both a storage element (e.g., to store or contribute to the storage of a state of memory cell 205) and as a selector element (e.g., to select or contribute to the selection of the memory cell 205, 211, 212, 213).

In some embodiments, operations such as reading and writing can be performed on memory cells 205, 211, 212, 213 by activating or selecting a corresponding wordline 210 and bitline 215. Accessing memory cells 205, 211, 212, 213 can be controlled through a wordline decoder 204 and a bitline decoder 202. For example, a wordline decoder 204 can receive a row address from the memory controller 245 (which can be a version of memory sub-system controller 110 or CMC 113 of FIG. 1) and activate the appropriate wordline 210 based on the received row address. Such a process can be referred to as decoding a row or wordline address. Similarly, a bitline decoder 202 can receive a column address from the memory controller 245 and activate the appropriate bitline 215. Such a process can be referred to as decoding a column or bitline address. A wordline decoder 204 and/or bitline decoder 202 can be examples of decoders implemented using decoder circuitry, for example. In some embodiments, wordline decoder 204 and/or bitline decoder 202 can include circuitry that is configured to increase a voltage applied to a wordline 210 or bitline 215 (respectively).

In some embodiments, a memory cell 205, 211, 212, 213 can be read (e.g., sensed) by a sense amplifier 206 when the memory cell 205, 211, 212, 213 is accessed (e.g., in cooperation with the memory controller 245, wordline decoder 204, and/or bitline decoder 202) to determine a logic state stored by the memory cell 205, 211, 212, 213. The sense amplifier 206 can provide an output signal indicative of (e.g., based at least in part on) the logic state stored by the memory cell 205, 211, 212, 213 to one or more components (e.g., to the bitline decoder 202, the memory controller 245). In some embodiments, the detected logic state can be provided to a host system 120 (e.g., a device that uses the memory device 130 for data storage), where such signaling can be provided directly from the memory controller 245, memory sub-system controller 115, or compensation management component 113.

In some embodiments, sense amplifier 206 can include various transistors or amplifiers to detect and amplify a difference in signals obtained based on reading a memory cell 205, 211, 212, 213, which can be referred to as latching. The detected logic state of memory cell 205, 211, 212, 213 can then be output through bitline decoder 202 as output. In some embodiments, sense amplifier 206 can be part of a bitline decoder 202 or row decoder 120. Alternatively, sense amplifier 206 can be connected to or in electronic communication with bitline decoder 202 or wordline decoder 204.

In some embodiments, read/write/erase operations can be performed on memory cells 205, 211, 212, 213. The performance of such operations can be controlled by memory controller 245 (which can be a version of memory sub-system controller 110 or compensation management component 113 of FIG. 1). Accordingly, operations, such as write operations, to be performed on memory array 200 can be distributed among the memory cells 205, 211, 212, 213. In one embodiment, the wordlines 210 can be grouped according to a value of a metric reflecting a property or characteristic (e.g., physical characteristic) of the memory cells of the group (e.g., a default voltage that needs to be applied to program the cells of the wordline to a particular programming level). For example, one such metric can be a value of a distribution spread reflecting the sensitivity of victim memory cells programmed to a particular programming level to different aggressor memory cell states. In the embodiment depicted in FIG. 2A, some of the wordlines 210 of array 200 can be grouped into a first group 250a that have cells with a $V_t$ distribution spread of X for programming level 2, and a second group 250b that have cells with a $V_t$ distribution spread of Y for programming level 2. Each of the groups can have a value of a metric that reflects a property or characteristic of the memory cells in the group falling within a range of possible values. In other words, wordlines with spreads (i.e., spreads of victim cell $V_t$ sub-distributions corresponding to respective different programming levels of adjacent aggressor memory cells) within one range of values can be included in one wordline group while wordlines with spreads within a different range of values can be included in a different wordline group.

These default values and other characteristics of the memory cells 205, 211, 212, 213 can be altered by the effects of C2C coupling and LM described above. Take for example, memory cell 211 that is specified to be accessed by a memory access operation (e.g. read/write) by specifying and activating the respective bitline and wordline at the intersection of which it is located. The specified wordline can be referred to as an n-th wordline ($WL_n$), and the adjacent wordlines can include adjacent wordline n−1 ($WL_{n-1}$) and adjacent wordline n+1 ($WL_{n+1}$). Thus, the specified cell 211 can have a respective group of adjacent cells. Each group of adjacent cells can include at least one cell that neighbors its respective specified cell (e.g., one cell 212 connected to $WL_{n-1}$ and/or one cell 213 connected to $WL_{n+1}$).

The memory cells 205, 211, 212, 213 can be categorized into aggressor cells and victim cells. More specifically, an aggressor memory cell can be defined by an effect its programming level has on a threshold voltage of an adjacent memory cell. The adjacent cell can thus be defined as the victim cell as it is affected by the programming level of the aggressor cell. This categorization and relationship is depicted in the flow chart of FIG. 2B.

Figure 2B:
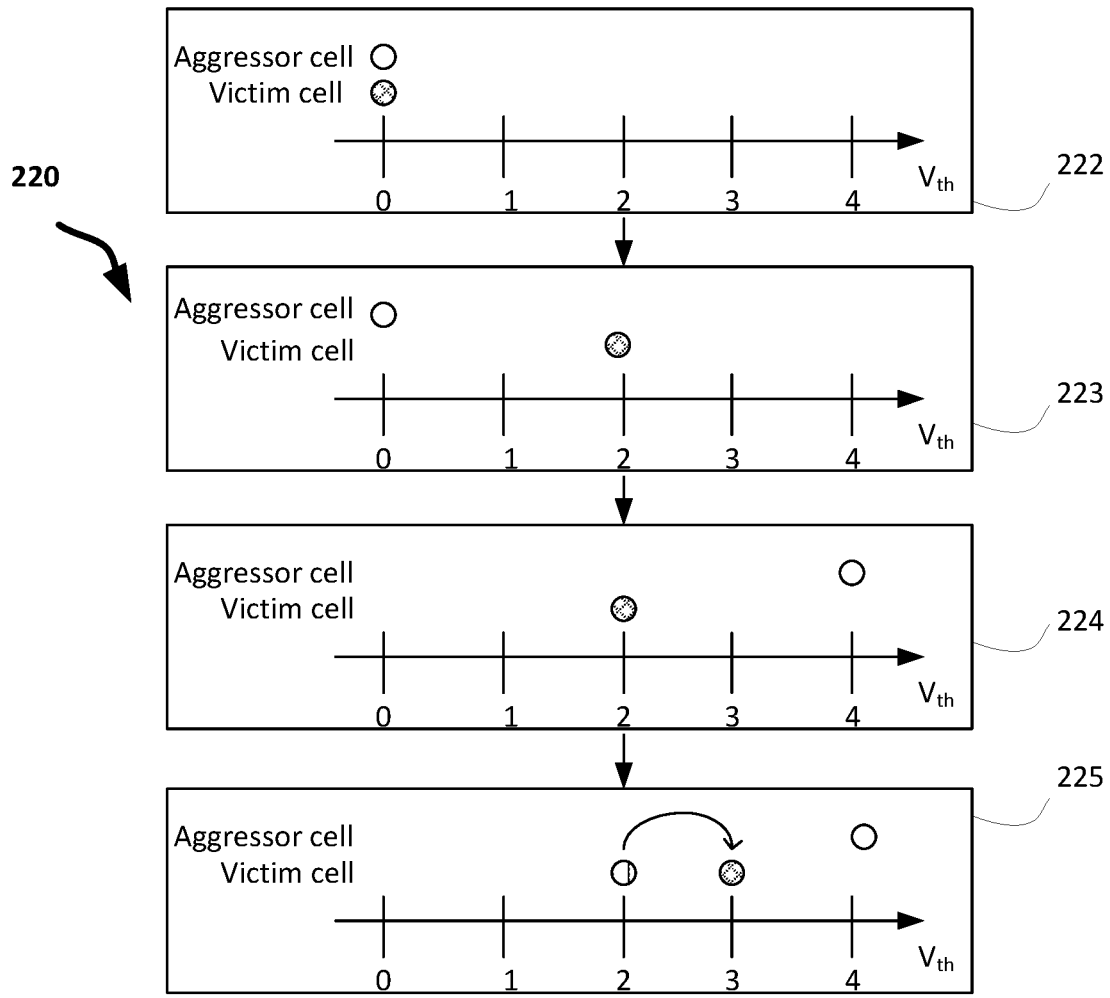
FIG. 2B is a flow chart showing the effects of an aggressor memory cell programming level on the threshold voltage of a victim memory cell in accordance with some embodiments of the present disclosure.

As illustrated in FIG. 2B, example memory cell 211 can be subject to the effects of phenomena such as LM and C2C coupling. If memory cell 211 is subject to an effect of a programming level of its adjacent cell 212, then memory cell 211 can be considered to be the victim cell 211 and the adjacent cell 212 can be considered to be the aggressor cell 212. Initially, at block 222, both cells have a $V_t$ of 0. When the victim cell 211 is programmed, at block 223, to have a $V_t$ of 2 v, it might not yet be affected by the programming level of the aggressor memory cell 212 since the aggressor memory cell 212 still has a $V_t$ of 0 v. Thereafter, the C2C coupling effect can become observable as the aggressor memory cell 212 is programmed at block 224 to have a $V_t$ of 4 v. As can be seen in block 225, the $V_t$ of the victim cell 211 can increase from 2 v to 3 v caused by the programming level corresponding to the aggressor memory cell's $V_t$ of 4 v due to C2C coupling. In a similar manner, the $V_t$ of victim memory cell 211 can be affected by the programming level (i.e., by the corresponding $V_t$) of adjacent aggressor cell 213.

Figure 2C:
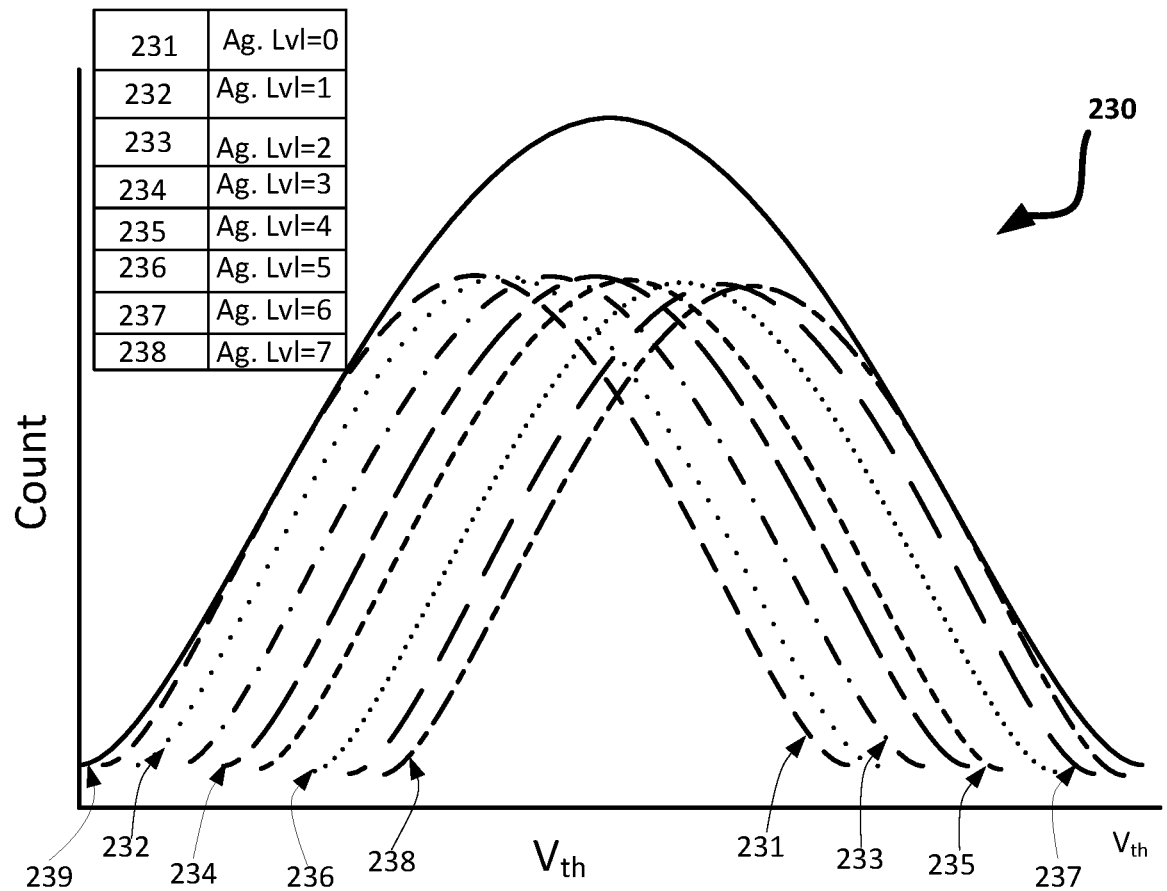
FIG. 2C illustrates an example threshold voltage distribution and its sub distributions in accordance with some embodiments of the present disclosure.

Thus, in various embodiments, the compensation management component 113 can compensate for the resulting distributions of $V_t$ of victim cells caused by aggressor cell programming levels. Take for example, a plot 230 of a victim cell's $V_t$, as depicted in FIG. 2C according to some embodiments of the disclosure. The example plot 230 of $V_t$ distributions is associated with an example group of TLC memory cells (e.g., cells 205, 211, 212, 213) programmed to programming level 3. As can be seen, the overarching distribution 239 of $V_t$ for the cells programmed to programming level 3 includes multiple sub-distributions 231-238. Each of these sub-distributions 231-238 reflect the $V_t$ of victim cells programmed to level 3 that happen to have an adjacent aggressor memory cell programmed to a particular programming level that shifts the respective $V_t$ of the victim cell. For example, sub-distribution 231 is a distribution of $V_t$ that is not shifted because the adjacent aggressor cells of the victim cells in the distribution are programmed to programming level 0. In contrast, sub-distribution 232 is shifted due to aggressor memory cells programmed to programming level 1. Sub-distribution 233 is shifted due to aggressor memory cells programmed to programming level 2. Sub-distribution 234 is shifted due to aggressor memory cells programmed to programming level 3. Sub-distribution 235 is shifted due to aggressor memory cells programmed to programming level 4. Sub-distribution 236 is shifted due to aggressor memory cells programmed to programming level 5. Sub-distribution 237 is shifted due to aggressor memory cells programmed to programming level 6. Sub-distribution 238 is shifted due to aggressor memory cells programmed to programming level 7.

Accordingly, it can be seen how the $V_t$ distribution for a set of victim memory cells has sub-distributions of $V_t$ dependent on the programming level of aggressor memory cells. For example, the sub-distribution 238 is shifted to the right relative to the default sub-distribution 231 by a greater amount than sub-distribution 234. This is because the victim cells of sub-distribution 238 are adjacent to aggressor cells of a higher programming level (i.e., 7) than those of sub-distribution 234. Notably, variations of the depicted shifts that are shown for one victim cell programming level can also exist for other programming levels of the victim cell. The other programming levels of the victim cells can likewise be affected by the programming levels of adjacent aggressor cells and have corresponding shifts in their respective sub-distributions.

Thus, in some embodiments, compensation management component 113 can compensate for these $V_t$ shifts by taking these shifts into consideration when performing read or write operations on the specified memory cells. In some embodiments, the parameters used in the operations can depend on the sensitivity of the victim cells connected to a particular wordline to the programming level of the adjacent aggressor memory cells. As noted earlier, this sensitivity can be reflected by a spread of a distribution such as the overarching distribution 239 depicted in FIG. 2C.

Figure 2D:
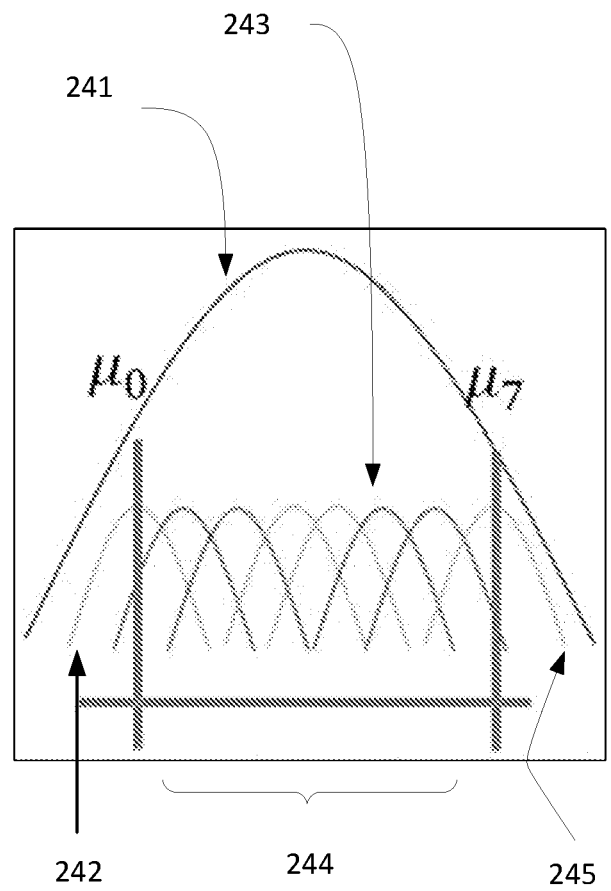
FIG. 2D depicts an example plot showing the determination of a spread of a threshold voltage distribution in accordance with some embodiments of the presence disclosure.

FIG. 2D depicts an example plot showing the determination of a spread 244 of a distribution 241, in accordance with some embodiments of the presence disclosure. For example, overarching $V_t$ distribution 241 (i.e., for a set of victim memory cells at programming level N) can include multiple sub-distributions 243. Each of the sub-distributions can be shifted by a different amount based on a corresponding aggressor cell programming level. In some embodiments, compensation management component 113 can determine the sensitivity of the victim cells to the programming level of adjacent aggressor cells by calculating the spread of the distribution 241, which can be defined as the difference between the mean $\mu_0$ of the sub-distribution 242 attributable to the lowest aggressor memory cell programming level and the mean $\mu_7$ of the sub-distribution 241 attributable to the highest aggressor memory cell programming level. If there is no aggressor dependency, then the spread will be zero. In some embodiments, the compensation management component 113 can determine the sensitivity of the victim cells to the programming level of adjacent aggressor cells by defining a metric other than the spread. For example, the compensation management component 113 can determine sensitivity by calculating the standard deviation of the overarching $V_t$ distribution 241. The standard deviation can be calculated using any known method for calculating standard deviation.

Furthermore, in some embodiments, the sensitivity (e.g., as reflected by the distribution spread) of a set of victim cells on a particular wordline at programming level M to adjacent aggressor memory cells can differ from the sensitivity of the same set of cells on the same wordline at programming level N to adjacent aggressor memory cells. Accordingly, in some embodiments, compensation management component 113 can determine the sensitivity (e.g., in terms of spread) of each of the victim cells on each of the wordlines to different programming levels of adjacent aggressor memory cells.

Figure 2E:
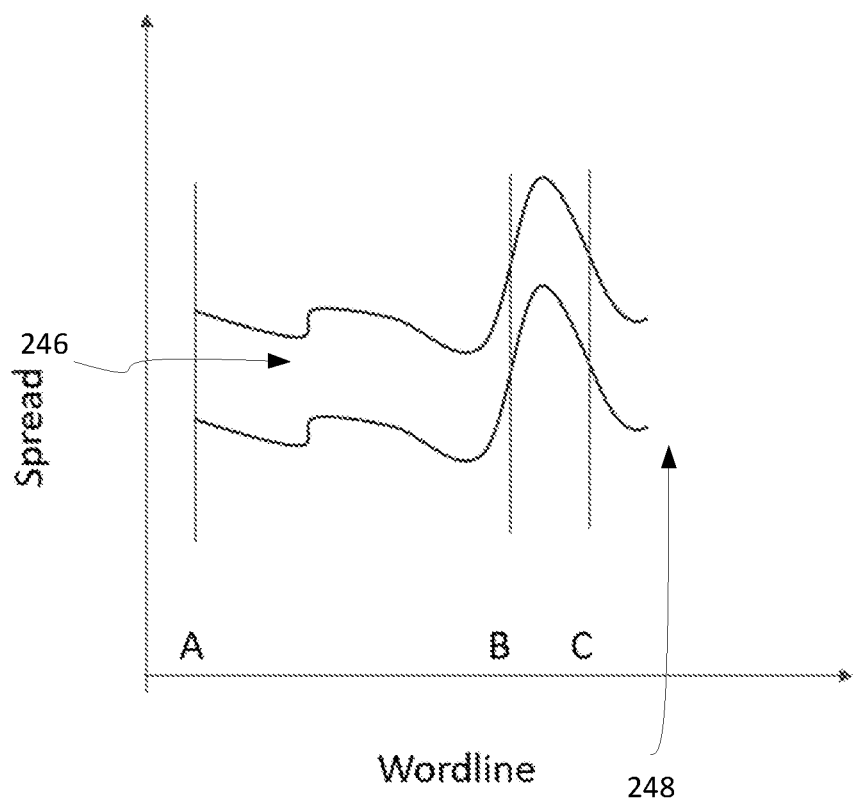
FIG. 2E depicts a set of plots of spreads for different victim memory cell programming levels in accordance with some embodiments of the present disclosure.

FIG. 2E depicts a set of plots of spreads (i.e., victim cell sub-distribution spreads defined by the means of the corresponding lowest and highest sub-distributions) for different victim memory cell programming levels, in accordance with some embodiments of the present disclosure. Each plot represents the spread for a given victim cell programming level as a function of a wordline index number. For example, plot 246 is a plot of the spread of the victim memory cell $V_t$ distributions for victim memory cells programming to programming level 1. Similarly, plot 248 is a plot of the spread of the victim memory cell $V_t$ distributions for victim memory cells programmed to programming level 7. Thus, it can be seen that, not only do different victim cells have different sensitivities depending on which wordline they are connected to, but they also have different sensitivities depending on the programming level to which the victim cells are programmed. Moreover, as illustrated in FIG. 2E, it can be seen that victim cells connected to wordlines in the region between B and C have a generally higher aggressor programming level dependence (i.e., have $V_t$ distributions that are more sensitive to adjacent aggressor memory cell programming levels) than the victim cells connected to wordlines in the range between A and B. Accordingly, in some embodiments, the compensation management component 113 performing compensatory operations to reduce BER by compensating for the C2C coupling and LM effects would be less effective for the wordlines in the range between A and B than for the wordlines in the range between B and C.

Figure 3:
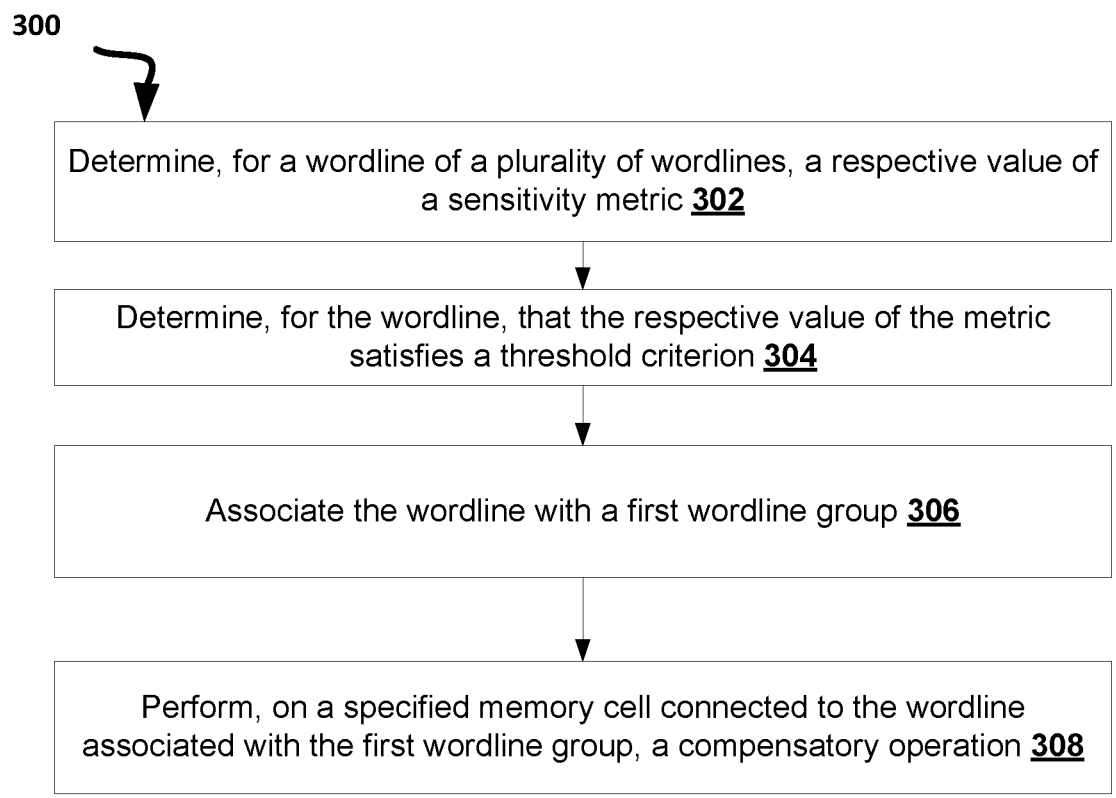
FIG. 3 is a flow diagram of an example method for managing compensation for cell-to-cell coupling and lateral migration in memory devices based on a sensitivity metric in accordance with some embodiments of the present disclosure.

FIG. 3 is a flow diagram of an example method 300 for managing compensation for cell-to-cell coupling and lateral migration in memory devices based on a sensitivity metric, in accordance with embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the compensation management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In some embodiments, the method 300 can be applied to a memory device having multiple victim cells and aggressor memory cells in one or more arrays. The aggressor memory cells can be defined as aggressors relative to memory cells that can be defined as victims based on the effect that the programming level of the aggressor cells has on a threshold voltage of the adjacent victim memory cells. Therefore, to mitigate the effect, at block 302, the processing logic can determine, for a wordline of a set of wordlines residing on a block of the memory device, a respective value of a sensitivity metric. The respective value of the sensitivity metric can be defined as a value of a sensitivity of a threshold voltage of a memory cell (e.g., a victim cell) connected to the wordline to a change in a threshold voltage of a memory cell adjacent to the memory cell (e.g., an aggressor cell). For example, the respective value of the sensitivity metric can be a spread value. As discussed with reference to FIGS. 2D-2E, a spread can be defined as the difference between the mean $\mu_0$ of a sub-distribution attributable to the lowest programming level of the adjacent memory cell (e.g., the aggressor cell) and the mean $\mu_7$ of a sub-distribution attributable to the highest programming level of the adjacent memory cell for TLC. For QLC, $\mu_7$ will be $\mu_{15}$. In some embodiments, the processing logic can determine the respective value of the sensitivity metric at manufacturing during characterization and offline testing of the memory device.

At block 304, the processing logic can determine, for the wordline, that the respective value of the sensitivity metric satisfies a threshold criterion. In some embodiments, determining that the respective value of the sensitivity metric satisfies the threshold criterion can include comparing the respective value of the sensitivity metric to a corresponding threshold value. In some embodiments, the threshold value can be a threshold sensitivity metric value. The threshold criterion can be satisfied when the respective value of the sensitivity metric is greater than or equal to the threshold sensitivity metric value. In some embodiments, the threshold sensitivity metric value can be set at manufacturing during characterization and offline testing of the memory device. In some embodiments, the threshold sensitivity metric value can be a configurable value.

At block 306, the processing logic associates the wordline with a wordline group. In some embodiments, the processing logic associates the wordline with a wordline group in response to determining at block 304 that the respective value of the sensitivity metric for the wordline satisfies the threshold criterion. In some embodiments, the wordline group includes one or more wordlines. Each wordline of the one or more wordlines can be associated with a respective value of the sensitivity metric that satisfies the threshold criterion (e.g., the respective value of the sensitivity metric is greater than or equal to the threshold sensitivity metric value described at block 304).

In some embodiments, the processing logic can store a record referencing the one or more wordlines associated with the wordline group in a data structure stored on the memory device. In some embodiments, the record can indicate, for each wordline in the wordline group, a corresponding location of the wordline on a die of the memory device. For example, the record can have an entry in the data structure for each wordline that stores the corresponding location (e.g., logical and/or physical address) of the die on which the wordline is located. The record can further have an entry in the data structure for each wordline that stores an index number and/or identifier of the wordline group with which the wordline is associated.

In some embodiments, the processing logic can determine that the respective value of the sensitivity metric for the wordline does not satisfy the threshold criterion. In some embodiments, determining that the respective value of the sensitivity metric for the wordline does not satisfy the threshold criterion can include comparing the respective value of the sensitivity metric to the corresponding threshold value and identifying that the respective value of the sensitivity metric is less than the threshold sensitivity metric value. In some embodiments, in response to determining that the respective value of the sensitivity metric for the wordline does not satisfy the threshold criterion, the processing logic can associate the wordline with a second wordline group. In some embodiments, the second wordline group includes one or more wordlines. Each wordline of the one or more wordlines of the second wordline group can be associated with a respective value of the sensitivity metric that does not satisfy the threshold value (e.g., the respective value of the sensitivity metric is less than the threshold sensitivity metric value). In some embodiments, the processing logic can store a record referencing the one or more wordlines associated with the second wordline group in a data structure stored on the memory device. In some embodiments, the record can indicate, for each wordline in the second wordline group, a corresponding location of the wordline on a die of the memory device. For example, the record can have an entry in the data structure for each wordline that stores the corresponding location (e.g., logical and/or physical address) of the die on which the wordline is located. The record can further have an entry in the data structure for each wordline that stores an index number and/or identifier of the second wordline group with which the wordline is associated.

At block 308, the processing logic performs a compensatory operation on a specified memory cell connected to the wordline of the wordline group. In some embodiments, the compensatory operation is an adjustment to a parameter of a memory access operation (e.g., programming/write operation) that is performed with respect to a memory cell connected to a wordline of the wordline group. In some embodiments, the processing logic receives a request to perform a memory access operation on the specified memory cell. The memory access operation can be a programming (e.g., write) operation. The processing logic can receive the request from a host (e.g., the host system 120). In some embodiments, the processing logic identifies an associated wordline group for the specified memory cell. Identifying the associated wordline group can include identifying, based on the physical characteristics of the specified memory cell, the wordline on which the specified memory cell is located. The processing logic can identify, using the record described at block 306, that the wordline on which the specified memory cell is located is associated with a particular wordline group. For example, the processing logic can identify the entry in the data structure of the record that stores the identifier of the wordline group with which the wordline is associated. The processing logic can further determine, based on the record, that the particular wordline group corresponds to a wordline group that includes one or more wordlines having respective values of the sensitivity metric that satisfy the threshold criterion (i.e., the wordline group includes one or more "weak" wordlines as described herein). Responsive to determining that the particular wordline group corresponds to the wordline group that includes one or more wordlines having respective values of the sensitivity metric that satisfy the threshold criterion, the processing logic can perform the compensatory operation on the specified memory cell. Performing the compensatory operation can include applying an adjustment to a parameter of the memory access operation. The adjustment to the parameter of the memory access operation can include an adjustment of one or more voltages applied to the specified memory cell. For example, applying the adjustment can include adjusting a program verify (PV) voltage with respect to the specified memory cell. In some embodiments, the adjustment to the parameter of the memory access operation compensates for an aggressor memory cell programming level, where the aggressor memory cell is adjacent to the specified memory cell.

Figure 4:
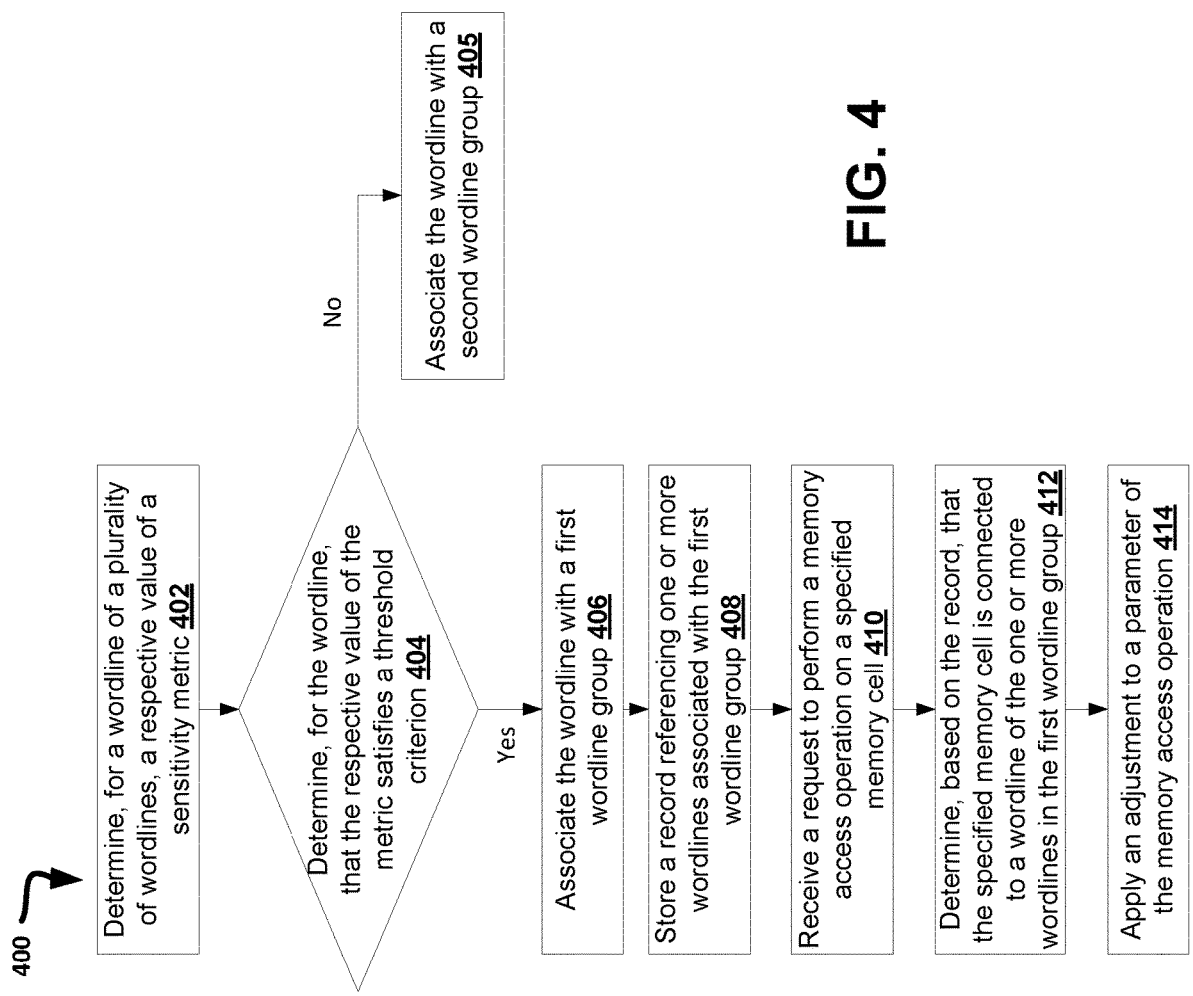
FIG. 4 is a flow diagram of an example method for managing compensation for cell-to-cell coupling and lateral migration in memory devices based on a sensitivity metric in accordance with some embodiments of the present disclosure.

FIG. 4 is a flow diagram of an example method 400 for managing compensation for cell-to-cell coupling and lateral migration in memory devices based on a sensitivity metric, in accordance with embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the compensation management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In some embodiments, the method 400 can be applied to a memory device having multiple victim cells and aggressor memory cells in one or more arrays. The aggressor memory cells can be defined as aggressors relative to memory cells that can be defined as victims based on the effect that the programming level of the aggressor cells has on a threshold voltage of the adjacent victim memory cells. Therefore, to mitigate the effect, at block 402, determine, for a wordline of a set of wordlines residing on a block of the memory device, a respective value of a sensitivity metric. The respective value of the sensitivity metric can be defined as a value of a sensitivity of a threshold voltage of a memory cell (e.g., a victim cell) connected to the wordline to a change in a threshold voltage of a memory cell adjacent to the memory cell (e.g., an aggressor cell). For example, the respective value of the sensitivity metric can be a spread value. As discussed with reference to FIGS. 2D-2E, a spread can be defined as the difference between the mean $\mu_0$ of a sub-distribution attributable to the lowest programming level of the adjacent memory cell (e.g., the aggressor cell) and the mean $\mu_7$ of a sub-distribution attributable to the highest programming level of the adjacent memory cell for TLC. For QLC, $\mu_7$ will be $\mu_{15}$. In some embodiments, the processing logic can determine the respective value of the sensitivity metric at manufacturing during characterization and offline testing of the memory device. In some embodiments, the respective value of the sensitivity metric can be the standard deviation of an overarching $V_t$ distribution (e.g., the overarching $V_t$ distribution 241 described with reference to FIGS. 2D-2E). The standard deviation can be calculated using any known method for calculating standard deviation.

At block 404, the processing logic can determine, for the wordline, that the respective value of the sensitivity metric satisfies a threshold criterion. In some embodiments, determining that the respective value of the sensitivity metric satisfies the threshold criterion can include comparing the respective value of the sensitivity metric to a corresponding threshold value. In some embodiments, the threshold value can be a threshold sensitivity metric value. The threshold criterion can be satisfied when the respective value of the sensitivity metric is greater than or equal to the threshold sensitivity metric value. In some embodiments, the threshold sensitivity metric value can be set at manufacturing during characterization and offline testing of the memory device. In some embodiments, the threshold sensitivity metric value can be a configurable value. In some embodiments, the processing logic can determine that the respective value of the sensitivity metric for the wordline does not satisfy the threshold criterion. In some embodiments, determining that the respective value of the sensitivity metric for the wordline does not satisfy the threshold criterion can include comparing the respective value of the sensitivity metric to the threshold value and identifying that the respective value of the sensitivity metric is less than the threshold sensitivity metric value. In some embodiments, the threshold criterion can be a threshold standard deviation value. In some embodiments, the threshold criterion can be satisfied when the standard deviation is greater than the threshold criterion.

At block 405, responsive to determining that the respective value of the sensitivity metric for the wordline does not satisfy the threshold criterion at block 404, the processing logic can associate the wordline with a wordline group (e.g., a second wordline group as labeled at block 405 in FIG. 4). In some embodiments, the second wordline group includes one or more wordlines. Each wordline of the one or more wordlines of the second wordline group can be associated with a respective value of the sensitivity metric that does not satisfy the threshold criterion (e.g., the respective value of the sensitivity metric is less than the threshold sensitivity metric value described at block 404).

In some embodiments, the processing logic can store a record referencing the one or more wordlines associated with the second wordline group in a data structure stored on the memory device. In some embodiments, the record can indicate, for each wordline in the second wordline group, a corresponding location of the wordline on a die of the memory device. For example, the record can have an entry in the data structure for each wordline that stores the corresponding location (e.g., logical and/or physical address) of the die on which the wordline is located. The record can further have an entry in the data structure for each wordline that stores an index number and/or identifier of the second wordline group with which the wordline is associated.

At block 406, the processing logic associates the wordline with another wordline group (e.g., a first wordline group as labeled at block 406 in FIG. 4). In some embodiments, the processing logic associates the wordline with the first wordline group in response to determining at block 404 that the respective value of the sensitivity metric for the wordline satisfies the threshold criterion. In some embodiments, the first wordline group includes one or more wordlines. Each wordline of the one or more wordlines of the first wordline group can be associated with a respective value of the sensitivity metric that satisfies the threshold criterion (e.g., the respective value of the sensitivity metric is greater than or equal to the threshold sensitivity metric value described at block 404).

At block 408, the processing logic can store a record referencing the one or more wordlines associated with the first wordline group in a data structure stored on the memory device. In some embodiments, the record can indicate, for each wordline in the first wordline group, a corresponding location of the wordline on a die of the memory device. For example, the record can have an entry in the data structure for each wordline that stores the corresponding location (e.g., logical and/or physical address) of the die on which the wordline is located. The record can further have an entry in the data structure for each wordline that stores an index number and/or identifier of the wordline group with which the wordline is associated.

At block 410, the processing logic receives a request to perform a memory access operation on the specified memory cell. The memory access operation can be a programming (e.g., write) operation. The processing logic can receive the request from a host (e.g., the host system 120).

At block 412, the processing logic can determine that the specified memory cell is connected to a wordline of the one or more wordlines in the first wordline group described at block 406. In some embodiments, the processing logic identifies an associated wordline group for the specified memory cell. Identifying the associated wordline group can include identifying, based on the physical characteristics of the specified memory cell, the wordline on which the specified memory cell is located. The processing logic can identify, using the record described at block 306, that the wordline on which the specified memory cell is located is associated with a particular wordline group (e.g., the first wordline group described at block 406). For example, the processing logic can identify the entry in the data structure of the record that stores the identifier of the wordline group with which the wordline is associated. The processing logic can further determine, based on the record, that the particular wordline group corresponds to a wordline group that includes one or more wordlines having respective values of the sensitivity metric that satisfy the threshold criterion (i.e., the wordline group includes one or more "weak" wordlines as described herein).

At block 414, the processing logic applies an adjustment to a parameter of the memory access operation (e.g., performs a compensatory operation as described herein). In some embodiments, a compensatory operation is an adjustment to a parameter of a memory access operation (e.g., programming/write operation) that is performed with respect to a memory cell connected to a wordline of the wordline group. Responsive to determining that the particular wordline group corresponds to the first wordline group (e.g., a wordline group that includes one or more wordlines having respective values of the sensitivity metric that satisfy the threshold criterion), the processing logic can perform the compensatory operation on the specified memory cell. Performing the compensatory operation can include applying an adjustment to a parameter of the memory access operation. The adjustment to the parameter of the memory access operation can include an adjustment of one or more voltages applied to the specified memory cell. For example, applying the adjustment can include adjusting a program verify (PV) voltage with respect to the specified memory cell. In some embodiments, the adjustment to the parameter of the memory access operation compensates for an aggressor memory cell programming level, where the aggressor memory cell is adjacent to the specified memory cell.

Figure 5:
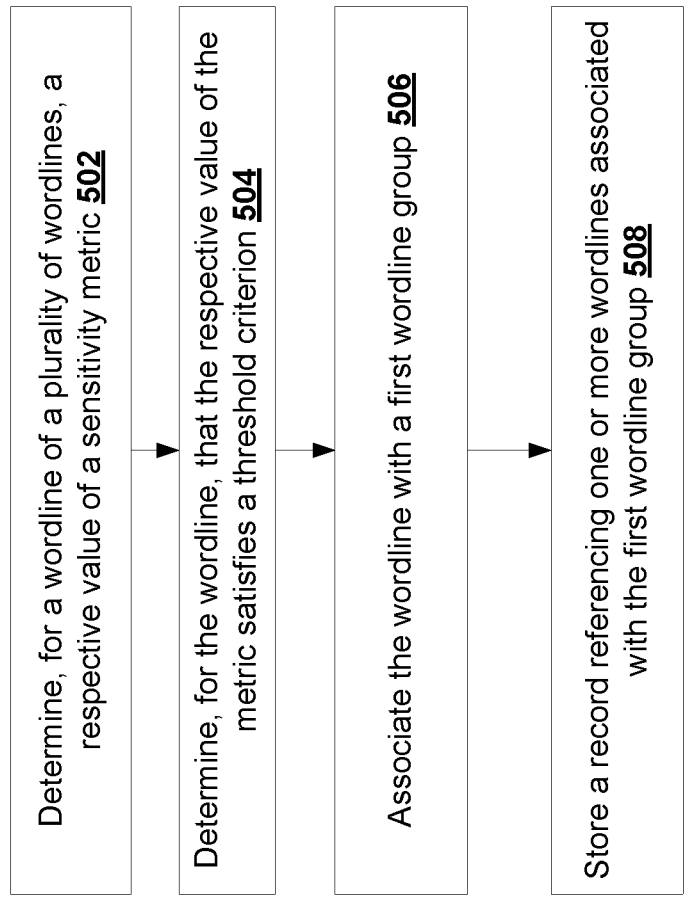
FIG. 5 is a flow diagram of an example method for managing compensation for cell-to-cell coupling and lateral migration in memory devices based on a sensitivity metric in accordance with some embodiments of the present disclosure.

FIG. 5 is a flow diagram of an example method 500 for managing compensation for cell-to-cell coupling and lateral migration in memory devices based on a sensitivity metric, in accordance with embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the compensation management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In some embodiments, the method 500 can be applied to a memory device having multiple victim cells and aggressor memory cells in one or more arrays. The aggressor memory cells can be defined as aggressors relative to memory cells that can be defined as victims based on the effect that the programming level of the aggressor cells has on a threshold voltage of the adjacent victim memory cells. Therefore, to mitigate the effect, at block 502, the processing logic can determine, for a wordline of a set of wordlines residing on a block of the memory device, a respective value of a sensitivity metric. The respective value of the sensitivity metric can be defined as a value of a sensitivity of a threshold voltage of a memory cell (e.g., a victim cell) connected to the wordline to a change in a threshold voltage of a memory cell adjacent to the memory cell (e.g., an aggressor cell). For example, the respective value of the sensitivity metric can be a spread value. As discussed with reference to FIGS. 2D-2E, a spread can be defined as the difference between the mean $\mu_0$ of a sub-distribution attributable to the lowest programming level of the adjacent memory cell (e.g., the aggressor cell) and the mean $\mu_7$ of a sub-distribution attributable to the highest programming level of the adjacent memory cell for TLC. For QLC, $\mu_7$ will be $\mu_{15}$. In some embodiments, the processing logic can determine the respective value of the sensitivity metric at manufacturing during characterization and offline testing of the memory device. In some embodiments, the respective value of the sensitivity metric can be the standard deviation of an overarching $V_t$ distribution (e.g., the overarching $V_t$ distribution 241 described with reference to FIGS. 2D-2E). The standard deviation can be calculated using any known method for calculating standard deviation.

At block 504, the processing logic can determine, for the wordline, that the respective value of the sensitivity metric satisfies a threshold criterion. In some embodiments, determining that the respective value of the sensitivity metric satisfies the threshold criterion can include comparing the respective value of the sensitivity metric to a corresponding threshold value. In some embodiments, the threshold value can be a threshold sensitivity metric value. The threshold criterion can be satisfied when the respective value of the sensitivity metric is greater than or equal to the threshold sensitivity metric value. In some embodiments, the threshold sensitivity metric value can be set at manufacturing during characterization and offline testing of the memory device. In some embodiments, the threshold sensitivity metric value can be a configurable value. In some embodiments, the threshold criterion can be a threshold standard deviation value. In some embodiments, the threshold criterion can be satisfied when the standard deviation is greater than the threshold criterion.

At block 506, the processing logic associates the wordline with a wordline group. In some embodiments, the processing logic associates the wordline with a wordline group in response to determining at block 504 that the respective value of the sensitivity metric for the wordline satisfies the threshold criterion. In some embodiments, the wordline group includes one or more wordlines. Each wordline of the one or more wordlines can be associated with a respective value of the sensitivity metric that satisfies the threshold criterion (e.g., the respective value of the sensitivity metric is greater than or equal to the threshold sensitivity metric value described at block 504).

At block 508, the processing logic stores a record referencing the one or more wordlines associated with the wordline group in a data structure stored on the memory device. In some embodiments, the record can indicate, for each wordline in the wordline group, a corresponding location of the wordline on a die of the memory device. For example, the record can have an entry in the data structure for each wordline that stores the corresponding location (e.g., logical and/or physical address) of the die on which the wordline is located. The record can further have an entry in the data structure for each wordline that stores an index number and/or identifier of the wordline group with which the wordline is associated.

In some embodiments, the processing logic can determine that the respective value of the sensitivity metric for the wordline does not satisfy the threshold criterion. In some embodiments, determining that the respective value of the sensitivity metric for the wordline does not satisfy the threshold criterion can include comparing the respective value of the sensitivity metric to the corresponding threshold value and identifying that the respective value of the sensitivity metric is less than the threshold sensitivity metric value. In some embodiments, in response to determining that the respective value of the sensitivity metric for the wordline does not satisfy the threshold criterion, the processing logic can associate the wordline with a second wordline group. In some embodiments, the second wordline group includes one or more wordlines. Each wordline of the one or more wordlines of the second wordline group can be associated with a respective value of the sensitivity metric that does not satisfy the threshold criterion (e.g., the respective value of the sensitivity metric is less than the threshold sensitivity metric value). In some embodiments, the processing logic can store a record referencing the one or more wordlines associated with the second wordline group in a data structure stored on the memory device. In some embodiments, the record can indicate, for each wordline in the second wordline group, a corresponding location of the wordline on a die of the memory device. For example, the record can have an entry in the data structure for each wordline that stores the corresponding location (e.g., logical and/or physical address) of the die on which the wordline is located. The record can further have an entry in the data structure for each wordline that stores an index number and/or identifier of the second wordline group with which the wordline is associated.

In some embodiments, the processing logic can perform a compensatory operation on a specified memory cell connected to the wordline of the wordline group. In some embodiments, the compensatory operation is an adjustment to a parameter of a memory access operation (e.g., programming/write operation) that is performed with respect to a memory cell connected to a wordline of the wordline group. In some embodiments, the processing logic receives a request to perform a memory access operation on the specified memory cell. The memory access operation can be a programming (e.g., write) operation. The processing logic can receive the request from a host (e.g., the host system 120). In some embodiments, the processing logic identifies an associated wordline group for the specified memory cell. Identifying the associated wordline group can include identifying, based on the physical characteristics of the specified memory cell, the wordline on which the specified memory cell is located. The processing logic can identify, using the record described at block 306, that the wordline on which the specified memory cell is located is associated with a particular wordline group. For example, the processing logic can identify the entry in the data structure of the record that stores the identifier of the wordline group with which the wordline is associated. The processing logic can further determine, based on the record, that the particular wordline group corresponds to a wordline group that includes one or more wordlines having respective values of the sensitivity metric that satisfy the threshold criterion (i.e., the wordline group includes one or more "weak" wordlines as described herein). Responsive to determining that the particular wordline group corresponds to the wordline group that includes one or more wordlines having respective values of the sensitivity metric that satisfy the threshold criterion, the processing logic can perform the compensatory operation on the specified memory cell. Performing the compensatory operation can include applying an adjustment to a parameter of the memory access operation. The adjustment to the parameter of the memory access operation can include an adjustment of one or more voltages applied to the specified memory cell. For example, applying the adjustment can include adjusting a program verify (PV) voltage with respect to the specified memory cell. In some embodiments, the adjustment to the parameter of the memory access operation compensates for an aggressor memory cell programming level, where the aggressor memory cell is adjacent to the specified memory cell.

Figure 6:
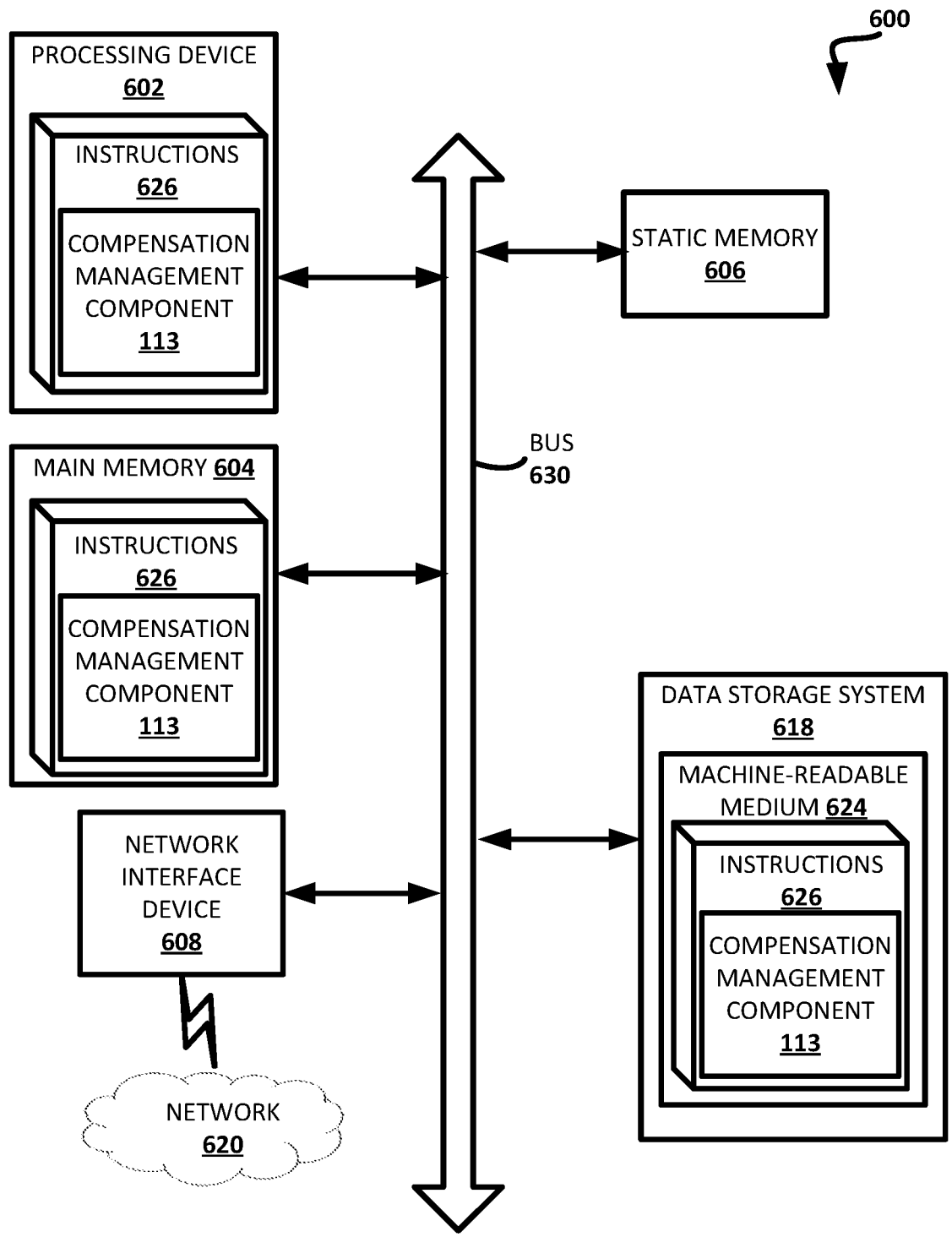
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the compensation management component 113 of FIG. 1, to method 300 of FIG. 3, to method 400 of FIG. 4, or to method 500 of FIG. 5). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a compensation management component (e.g., the compensation management component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
    a memory device comprising a plurality of memory cells each associated with a corresponding wordline of a plurality of wordlines located on a die of the memory device; and
    a processing device, operatively coupled with the memory device, to perform operations comprising:
        determining, for a wordline of the plurality of wordlines, a respective value of a sensitivity metric that reflects a sensitivity of a threshold voltage of a memory cell associated with the wordline to a change in a threshold voltage of an adjacent memory cell;
        determining, for the wordline, that the respective value of the sensitivity metric satisfies a threshold criterion;
        responsive to determining that the respective value of the sensitivity metric satisfies the threshold criterion, associating the wordline with a first wordline group, wherein the first wordline group comprises one or more wordlines, and wherein each wordline of the one or more wordlines is associated with a respective value of the sensitivity metric that satisfies the threshold criterion; and
        performing, on a specified memory cell connected to the wordline associated with the first wordline group, a compensatory operation to adjust one or more voltages applied to the specified memory cell.

2. The system of claim 1, further comprising:
    storing, on the memory device, a record referencing the one or more wordlines associated with the first wordline group, wherein the record indicates, for each wordline in the first wordline group, a corresponding location on the die of the memory device.

3. The system of claim 1, further comprising:
    determining, for the wordline, that the respective value of the sensitivity metric does not satisfy the threshold criterion; and responsive to determining that the respective value of the sensitivity metric does not satisfy the threshold criterion, associating the wordline with a second wordline group, wherein the second wordline group comprises one or more wordlines, and wherein each wordline of the one or more wordlines is associated with a respective value of the sensitivity metric that does not satisfy the threshold criterion.

4. The system of claim 1, wherein performing the compensatory operation comprises:
receiving a request to perform a memory access operation on the specified memory cell;
determining, based on a record that references the one or more wordlines in the first wordline group, that the specified memory cell is associated with a wordline of the one or more wordlines in the first wordline group; and
applying an adjustment to the one or more voltages applied to the specified memory cell responsive to determining that the specified memory cell is associated with the wordline of the one or more wordlines in the first wordline group.

5. The system of claim 4, wherein the adjustment to the one or more voltages applied to the specified memory cell compensates for a programming level of an aggressor memory cell, wherein the aggressor memory cell is adjacent to the specified memory cell.

6. The system of claim 4, wherein the adjustment to the one or more voltages applied to the specified memory cell comprises an adjustment to a program verify (PV) voltage with respect to the specified memory cell.

7. The system of claim 1, wherein determining the respective value of the sensitivity metric comprises:
determining a difference between the threshold voltage of the memory cell associated with the wordline corresponding to a first programming level of the threshold voltage of the adjacent memory cell and the threshold voltage of the memory cell associated with the wordline corresponding to a second programming level of the threshold voltage of the adjacent memory cell, wherein the first programming level is a maximum programming level and the second programming level is a minimum programming level of the adjacent memory cell.

8. A method comprising:
determining, by a processing device operatively coupled with a memory device comprising a plurality of memory cells each associated with a corresponding wordline of a plurality of wordlines located on a die of the memory device, for a wordline of the plurality of wordlines, a respective value of a sensitivity metric that reflects a sensitivity of a threshold voltage of a memory cell associated with the wordline to a change in a threshold voltage of an adjacent memory cell;
determining, for the wordline, that the respective value of the sensitivity metric satisfies a threshold criterion;
responsive to determining that the respective value of the sensitivity metric satisfies the threshold criterion, associating the wordline with a first wordline group, wherein the first wordline group comprises one or more wordlines, and wherein each wordline of the one or more wordlines is associated with a respective value of the sensitivity metric that satisfies the threshold criterion; and
performing, on a specified memory cell connected to the wordline associated with the first wordline group, a compensatory operation to adjust one or more voltages applied to the specified memory cell.

9. The method of claim 8, further comprising:
storing, on the memory device, a record referencing the one or more wordlines associated with the first wordline group, wherein the record indicates, for each wordline in the first wordline group, a corresponding location on the die of the memory device.

10. The method of claim 8, further comprising:
determining, for the wordline, that the respective value of the sensitivity metric does not satisfy the threshold criterion; and
responsive to determining that the respective value of the sensitivity metric does not satisfy the threshold criterion, associating the wordline with a second wordline group, wherein the second wordline group comprises one or more wordlines, and wherein each wordline of the one or more wordlines is associated with a respective value of the sensitivity metric that does not satisfy the threshold criterion.

11. The method of claim 8, wherein performing the compensatory operation comprises:
receiving a request to perform a memory access operation on the specified memory cell;
determining, based on a record that references the one or more wordlines in the first wordline group, that the specified memory cell is associated with a wordline of the one or more wordlines in the first wordline group; and
applying an adjustment to the one or more voltages applied to the specified memory cell responsive to determining that the specified memory cell is associated with the wordline of the one or more wordlines in the first wordline group.

12. The method of claim 11, wherein the adjustment to the one or more voltages applied to the specified memory cell compensates for a programming level of an aggressor memory cell, wherein the aggressor memory cell is adjacent to the specified memory cell.

13. The method of claim 11, wherein the adjustment to the one or more voltages applied to the specified memory cell comprises an adjustment to a program verify (PV) voltage with respect to the specified memory cell.

14. The method of claim 8, wherein determining the respective value of the sensitivity metric comprises:
determining a difference between the threshold voltage of the memory cell associated with the wordline corresponding to a first programming level of the threshold voltage of the adjacent memory cell and the threshold voltage of the memory cell associated with the wordline corresponding to a second programming level of the threshold voltage of the adjacent memory cell, wherein the first programming level is a maximum programming level and the second programming level is a minimum programming level of the adjacent memory cell.

15. A non-transitory computer-readable storage medium comprising instructions that, when executed by a processing device, cause the processing device to perform operations comprising:
determining, for a wordline of a plurality of wordlines, a respective value of a sensitivity metric that reflects a sensitivity of a threshold voltage of a memory cell associated with the wordline to a change in a threshold voltage of an adjacent memory cell;
determining, for the wordline, that the respective value of the sensitivity metric satisfies a threshold criterion;

responsive to determining that the respective value of the sensitivity metric satisfies the threshold criterion, associating the wordline with a first wordline group, wherein the first wordline group comprises one or more wordlines, and wherein each wordline of the one or more wordlines is associated with a respective value of the sensitivity metric that satisfies the threshold criterion;

storing, on a memory device, a record referencing the one or more wordlines associated with the first wordline group, wherein the record indicates, for each wordline in the first wordline group, a corresponding location on a die of the memory device; and performing, on a specified memory cell connected to the wordline associated with the first wordline group, a compensatory operation to adjust one or more voltages applied to the specified memory cell.

16. The non-transitory computer-readable storage medium of claim 15, wherein to perform the compensatory operation, the processing device is to perform operations further comprising:

receiving a request to perform a memory access operation on the specified memory cell;

determining, based on the record, that the specified memory cell is associated with a wordline of the one or more wordlines in the first wordline group; and applying an adjustment to the one or more voltages applied to the specified memory cell responsive to determining that the specified memory cell is associated with the wordline of the one or more wordlines in the first wordline group.

17. The non-transitory computer-readable storage medium of claim 16, wherein the adjustment to the one or more voltages applied to the specified memory cell compensates for a programming level of an aggressor memory cell, wherein the aggressor memory cell is adjacent to the specified memory cell.

18. The non-transitory computer-readable storage medium of claim 15, wherein the processing device is to perform operations further comprising:

determining, for the wordline, that the respective value of the sensitivity metric does not satisfy the threshold criterion; and responsive to determining that the respective value of the sensitivity metric does not satisfy the threshold criterion, associating the wordline with a second wordline group, wherein the second wordline group comprises one or more wordlines, and wherein each wordline of the one or more wordlines is associated with a respective value of the sensitivity metric that does not satisfy the threshold criterion.

19. The non-transitory computer-readable storage medium of claim 15, wherein, to determine the respective value of the sensitivity metric, the processing device is to perform operations further comprising:

determining a difference between the threshold voltage of the memory cell associated with the wordline corresponding to a first programming level of the adjacent memory cell and the threshold voltage of the memory cell associated with the wordline corresponding to a second programming level of the adjacent memory cell, wherein the first programming level is a maximum programming level and the second programming level is a minimum programming level of the adjacent memory cell.

20. The non-transitory computer-readable storage medium of claim 16, wherein the adjustment to the one or more voltages applied to the specified memory cell comprises an adjustment to a program verify (PV) voltage with respect to the specified memory cell.

* * * * *